US008918295B2

(12) United States Patent
Lelong

(10) Patent No.: US 8,918,295 B2
(45) Date of Patent: Dec. 23, 2014

(54) DISTRIBUTED REFLECTOMETRY DEVICE AND METHOD FOR DIAGNOSING A TRANSMISSION NETWORK

(75) Inventor: Adrien Lelong, Orsay (FR)

(73) Assignee: Commissariat à l'énergie Atomique et aux Énergies alternatives, Paris (FR)

( * ) Notice: Subject to any disclaimer, the term of this patent is extended or adjusted under 35 U.S.C. 154(b) by 672 days.

(21) Appl. No.: 13/123,228

(22) PCT Filed: Oct. 13, 2009

(86) PCT No.: PCT/EP2009/063318
§ 371 (c)(1),
(2), (4) Date: Sep. 1, 2011

(87) PCT Pub. No.: WO2010/043602
PCT Pub. Date: Apr. 22, 2010

(65) Prior Publication Data
US 2011/0307197 A1    Dec. 15, 2011

(30) Foreign Application Priority Data

Oct. 15, 2008 (FR) ...................... 08 56992

(51) Int. Cl.
*G01R 31/00* (2006.01)
*G01R 31/11* (2006.01)
*G01R 31/08* (2006.01)

(52) U.S. Cl.
CPC .............. *G01R 31/11* (2013.01); *G01R 31/086* (2013.01); *G01R 31/008* (2013.01); *G01R 31/006* (2013.01)
USPC ................... 702/58; 702/57; 702/59; 702/60; 702/64; 702/66; 702/69; 702/71; 702/118; 702/120; 702/125; 702/190; 702/194

(58) Field of Classification Search
USPC ......... 702/58, 117–123, 182–190, 57, 59, 60, 702/64, 66, 69, 71, 125, 194
See application file for complete search history.

(56) References Cited

U.S. PATENT DOCUMENTS

| 4,521,728 | A | * | 6/1985 | Li ................................. 324/638 |
| 5,534,783 | A | * | 7/1996 | Meyer .......................... 324/533 |
| 6,529,844 | B1 | * | 3/2003 | Kapetanic et al. .............. 702/85 |

FOREIGN PATENT DOCUMENTS

FR    2907910    5/2008

OTHER PUBLICATIONS

Naik S. et al. (hereinafter "Naik"): Multicarrier Reflectometry, IEEE Sensors Journal, IEEE Service Center, New York, NY, US, vol. 6, No. 3, Jun. 1, 2006, pp. 812-818, XP002507430, ISSN: 1530-437X.*

(Continued)

*Primary Examiner* — Hyun Park
(74) *Attorney, Agent, or Firm* — Knobbe Martens Olson & Bear LLP

(57) ABSTRACT

A distributed reflectometry device for diagnosing a network is disclosed. According to one aspect, the device includes at least one transmission line and several reflectometers connected to the network. A transmission portion of the device includes a first memory configured to store at least one test signal and a second memory configured to store weighting coefficients. The transmission portion may also include a first multiplier of a test signal (s) with a coefficient $\beta_m$, for producing a measurement m and a digital-to-analog converter connected to the line. A reception portion of the device includes an analog-to-digital converter configured to receive a signal from the line and provide a vector for the measurement m, a second multiplier of configured to multiply the vector with the coefficient $\beta_m$, an averaging module, and a post-processing and analysis module.

20 Claims, 3 Drawing Sheets

(56) References Cited

OTHER PUBLICATIONS

Ravot et al, Distributed reflectometry-based diagnosis for complex wired networks, EMC:Safety, Reliability and Security of Communication and Transportation Syst, EMC Workshop, Paris, Jun. 2007.

Preliminary Search Report dated Jul. 22, 2009 for French Patent Application No. 0856992.

International Search Report and Written Opinion dated Oct. 13, 2009 for PCT Application No. PCT/EP2009/063318.

Naik et al., "Multicarrier Reflectometry", IEEE Sensors Journal, vol. 6, No. 3, Jun. 3, 2006, pp. 812-818.

Nishiyama et al., "A Method for Fault detecting on Twisted Pair Cable Network by use of M-sequence Correlation", The $30^{th}$ Annual Conference of the IEEE Industrial Electronics Society, Nov. 2-6, 2004, Busan, Korea, pp. 1929-1934.

Smith et al., "Analysis of Spread Spectrum Time Domain Reflectometry for Wire Fault Location", IEEE Sensors Journal, vol. 5, No. 6, Dec. 6, 2005, pp. 1469-1478.

\* cited by examiner

DISTRIBUTED REFLECTOMETRY DEVICE AND METHOD FOR DIAGNOSING A TRANSMISSION NETWORK

TECHNICAL FIELD

This invention relates to a distributed reflectometry device and method for diagnosing a transmission network, e.g., a wired network.

The field of the invention, in particular, is that of on-board diagnostics of cable networks via reflectometry.

BACKGROUND

Reflectometry consists in transmitting a signal over a cable network and in then measuring the returned signals. The delay and amplitude of these echoes enable information to be obtained about the structure or electrical faults present in said network. More generally speaking, each echo corresponds to one singularity. It is then possible to locate, characterise and possibly predict a breakdown. The well-known conventional reflectometry methods are TDR (Time Domain Reflectometry) and FDR (Frequency Domain Reflectometry).

The purpose of reflectometry is to retrace the abrupt variations in the characteristic impedance of one or more transmission lines, which may correspond to branches or faults (short circuit or open circuit), by determining the reflection coefficients $\alpha_k$ of the line or lines.

The principle of reflectometry is based on the propagation of voltage waves in these lines. It consists in sending a known signal $x(t)$ in an electrical line and in then measuring the signal $x_s(t)$ returned by the line. The measurement taken then consists of the set of echoes due to the variations in the characteristic impedance of the line. Analysis of the measurement $x_s(t)$ in relation to the original signal $x(t)$ provides an estimate of the line response.

The diagram of FIG. 1 shows the overall operation of a reflectometry device. This figure shows:
- a transmission portion which includes:
  - a shape generator 10,
  - a digital-to-analog converter 11,
  - a first electrical coupling device 12 connected to the line being diagnosed 13,
- a reception portion which includes:
  - a second electrical coupling device 14 connected to line 13,
  - an analog-to-digital converter 15,
  - a signal averaging and processing device 16.

The signal $x(t)$ sent on line 13 by the transmission portion is subject to constraints specific to the application and reflectometry method used. These constraints result from the interference problems between the reflectometry signal and the target signal. The electrical coupling is a purely electrical portion the function of which is to carry out the interfacing between the reflectometry device (transmission, reception of the signal) and the line 13 by providing functions such as impedance matching, electrical protection or else possible filtering.

The relationship between $x_s(t)$ and $x(t)$ is given by the relationship: $x_s(t)=x(t)*h(t)$, * representing convolution product. In the frequency domain, the following relationship is obtained: $X_s(f)=X(f)H(f)$.

As a first approximation, it may be considered that $h(t)$ is a series of Dirac pulses corresponding to the expression:

$$h(t)=\Sigma \alpha_k \delta(t-\tau_k) \quad (1)$$

In diagnostic systems, reflectometry is generally carried out by a digital system. Sampled signals are then worked on, and the final result, namely the pulse response, is likewise sampled (or discretised).

The test signal is defined by the vector $\underline{s}=(s_0, s_1, \ldots s_{N-1})$, N being the number of samples corresponding to one period. This signal may or may not be transmitted periodically, based on the type of signal and the processing carried out by the system. When the transmission is periodic of period N, the measurement signal obtained after sampling is given by $$\hat{\underline{y}}=H\underline{s}+\underline{n} \quad (2)$$

$\underline{y}=(y_0, y_1, \ldots y_{N-1})$: discretised measurement signal,
n represents the additive measurement noise.
H is the matrix M×N corresponding to the pulse response of the discretised line.

$$H\begin{pmatrix} h_0 & h_1 & \ldots & h_{N-1} \\ h_{N-1} & h_0 & \ldots & h_{N-1} \\ \vdots & \ddots & \ddots & \vdots \\ h_1 & h_2 & \ldots & h_0 \end{pmatrix}$$

This matrix H represents the convolution operation. Post-processing of the signal $\hat{y}$ next enables an estimate of the line pulse, response to be retrieved, which can be analysed in order to detect possible faults.

In practice, it is often advantageous to carry out several measurements and to calculate the average thereof so as to improve the signal-to-noise ratio. Since the test signal is indeed transmitted periodically, if it is considered that the line response $\underline{h}$ varies slowly relative to the period $T=NT_e$, it may be considered that the signal remains stationary over several measurements. The final measurement signal is then obtained by $$\hat{\underline{y}} = \frac{1}{M}\sum_{m=0}^{M-1} \underline{y}^{(m)} \quad (3)$$

M: is the number of measurements
$\underline{y}^{(m)}$: is the $m^{th}$ measurement.

The objective of distributed reflectometry is to be capable of carrying out several reflectometric measurements simultaneously at several points of a wired network in order to resolve the topology-related ambiguities.

Distributed reflectometry enables diagnostic measurements to be carried out simultaneously at several points of a network, several reflectometers being connected to said network and transmitting a test signal at the same time. The problem solved by this method is that of interference with the measurement of each reflectometer by the test signals of the other reflectometers, which requires processing of the signal received. Distributed reflectometry thus enables certain ambiguities related to the structure of the network to be resolved. To illustrate this problem of ambiguity, reference may be made to the case of a Y network. When a fault is detected in such a network, the distance separating the same from the point of measurement is known, however it is not always possible to determine the branch on which the same is located. Among other things, distributed reflectometry enables this type of ambiguity to be resolved, by carrying out processing which consists in discriminating between the signals derived from the various reflectometers so as to preserve only the signal of interest. A discrimination algorithm is described as the processing which enables this functionality to be achieved.

As shown in FIG. 2, p reflectometers are thus connected to a network 20 and transmit a test signal at the same time. Each reflectometer measures the echoes related to its own test signal but likewise to those of the others. These other signals comprise additive noise capable of rendering the use of the measurement impossible. The elimination of this disturbance, which is called "interference noise," is therefore a necessity.

Sources $S_0, \ldots, S_{p-1}$ transmit the various test signals on the network 20. The reflectometer 21, which corresponds to a source $S_0$, receives a sum $\Sigma$ of all of these signals filtered by the network 20. $H_{p1,p2}$ represents the transfer function of the path taken by the signal between the reflectometers $p_1$ and $p_2$.

The document cited [1] at the end of the specification describes a reflectometry method, which consists in using sequence M-type (or "maximum-length sequence") pseudo-random sequences as a test signal and in minimising the intercorrelation between the sequences generated by the various reflectometers. The post-processing (discrimination algorithm) next consists in applying matched filtering as in the STDR (Sequence Time Domain Reflectometry) method.

Such a reflectometry method thus described in the cited document [1] has the following disadvantages, in particular:
  it does not enable complete cancelling of the contribution of the other reflectometers. Residual noise remains,
  it requires the use of an M sequence-type (or LFSR, Logical Feedback Shift Register, of maximum length). In some applications, test signals, such as multicarrier signals, may be necessary due to the constraints of the application in question.

The aim of the invention is a so-called weighted average distributed reflectometry device and method enabling these disadvantages to be resolved by improving the measuring accuracy.

DESCRIPTION OF CERTAIN INVENTIVE ASPECTS

According to some aspects, a distributed reflectometry device for diagnosing a network is disclosed. The device includes at least one transmission line and several reflectomers connected to the network. The reflectometers includes:
  a transmission portion which comprises:
    a first memory containing at least one test signal $\underline{s}$,
    a second memory containing M weighting coefficients enabling each reflectometer to be differentiated,
    a first multiplier of a test signal $\underline{s}$ of N samples with a coefficient $\beta_m$, providing a vector $\underline{x}$,
    a digital-to-analog converter connected to the line,
  a reception portion which comprises:
    an analog-to-digital converter receiving a signal y(t) from the line and providing a vector $\underline{\hat{y}}^{(m)}$ for a measurement m,
    a second multiplier of this vector $\underline{\hat{y}}^{(m)}$ with the coefficient $\beta_m$,
    an averaging module producing the average $$\frac{1}{\beta}\sum_{m=0}^{M-1}\beta_m\underline{\hat{y}}^{(m)} = \hat{y}$$

enabling the contribution of the other reflectometers to be cancelled,
a post-processing and analysis module.

In one application, the number of measurements is such that: $M=kM_{min}$, with: $k \in \aleph$ and $M_{min}$ a minimum number of measurements.

In the case where the reflectometers are synchronised, the vectors are orthogonal relative to one another, namely:

$$\underline{b}_{(p1)}^T\underline{b}_{(p2)}=0$$

Advantageously, the number of minimum measurements Mmin is equal to the number p of reflectometers and the weighting coefficients are such that $\beta_m^{(p)}=[H_p]p,m$, $H_p$ being the Hadamar matrix of order p.

In the case where the reflectometers are not synchronised, the weighting vectors meet the following condition:

$$\forall d \in o, \ldots, M-1$$

$$\underline{b}_{(p1)}^T\Pi^d\underline{b}_{(p2)}=0$$

where d designates the number of offset samples between the two reflectometers and $\Pi$ the cyclic permutation matrix. The minimum number of measurements can advantageously be equal to twice the number of reflectometers, the weighting coefficients being sine curves. The minimum number of measurements Mmin can be such that $M_{min}=2^{p-1}$, the weighting coefficients then being such that $$\beta_m^{(p)} = \text{sign}\left[\sin\left(2^p\frac{\pi m}{M}\right)\right],$$

which is a Rademacher function.

This device is advantageously a distributed reflectometry device for on-line diagnosis of a network.

The invention likewise relates to a distributed reflectometry method for on-line diagnosis of a network, comprising at least one transmission line and several reflectometers connected to this network, characterised in that, implemented in one of these reflectometers, it includes the following steps:
  during transmission:
    a step for multiplying a test signal $\underline{s}$ with a coefficient $\beta_m$ stored in a memory for a measurement m and providing a vector $\underline{x}$,
    a digital-to-analog conversion step providing a signal x(t) linked to the line,
  during reception:
    an analog-to-digital conversion step receiving a signal y(t) from the line and providing a vector $\underline{\hat{y}}^{(m)}$ for the measurement m,
    a step for multiplying this vector $\underline{\hat{y}}^{(m)}$ with a coefficient $\beta_m$,
    an averaging step producing the average $$\frac{1}{\beta}\sum_{m=0}^{M-1}\beta_m\underline{\hat{y}}^{(m)} = \hat{y}$$

enabling the contribution of the other reflectometers to be cancelled,
a post-processing and analysis step.

The method of the invention is advantageously a distributed reflectometry method for on-line diagnosis of a network.

The method of the invention proposes a new discrimination algorithm of rather low complexity for the reflectometry signal, which enables easy integration of weighted-average reflectometry into an on-board system.

Two main advantages emerge from the device and method of the invention:

The interference resulting from the other test signals, corresponding to the other reflectometers present on the network, can be entirely cancelled out, whereas it is only attenuated using other methods of the known prior art.

The test signal used is completely independent of the method of the invention and can therefore be chosen based on the constraints of the application. Such a feature is particularly advantageous in the case of on-line diagnosis, i.e., when the network is diagnosed while the target system is operating. In such an application, it is indeed possible to be led to use particular test signals complying with certain constraints so as to limit the interference between the reflectometry and the target system (e.g., multicarrier reflectometry).

Numerous applications of the device and method of the invention are possible, in particular in the automobile and avionics fields, etc.

DETAILED DESCRIPTION OF CERTAIN ILLUSTRATIVE EMBODIMENTS

Hereinafter, the following notations will be used:
a: real or complex scalar quantity
$\underline{a}$: real or complex vector
$a_k$: $k^{nth}$ component of the vector or signal $\underline{a}$
a(t): real or complex continuous signal
A(f): Fourier transform of the continuous signal a(t)
A: real or complex matrix
$\Re$: all of the real numbers
$\aleph$: all of the natural numbers.

Figure 1:
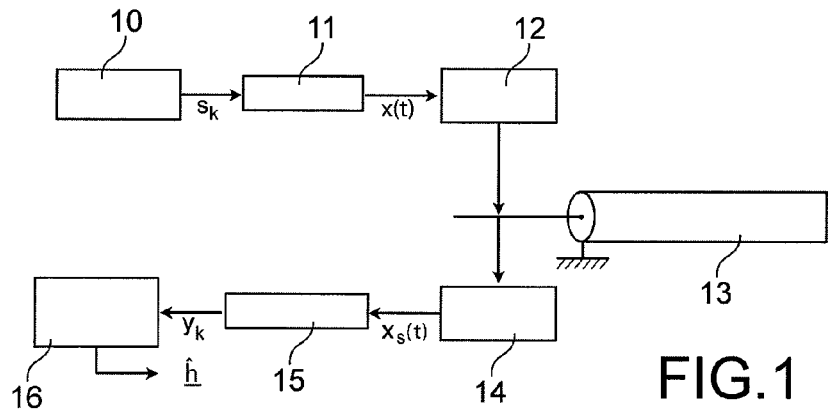
FIG. 1 shows the block diagram of a reflectometry diagnostic device of the known prior art.
Figure 2:
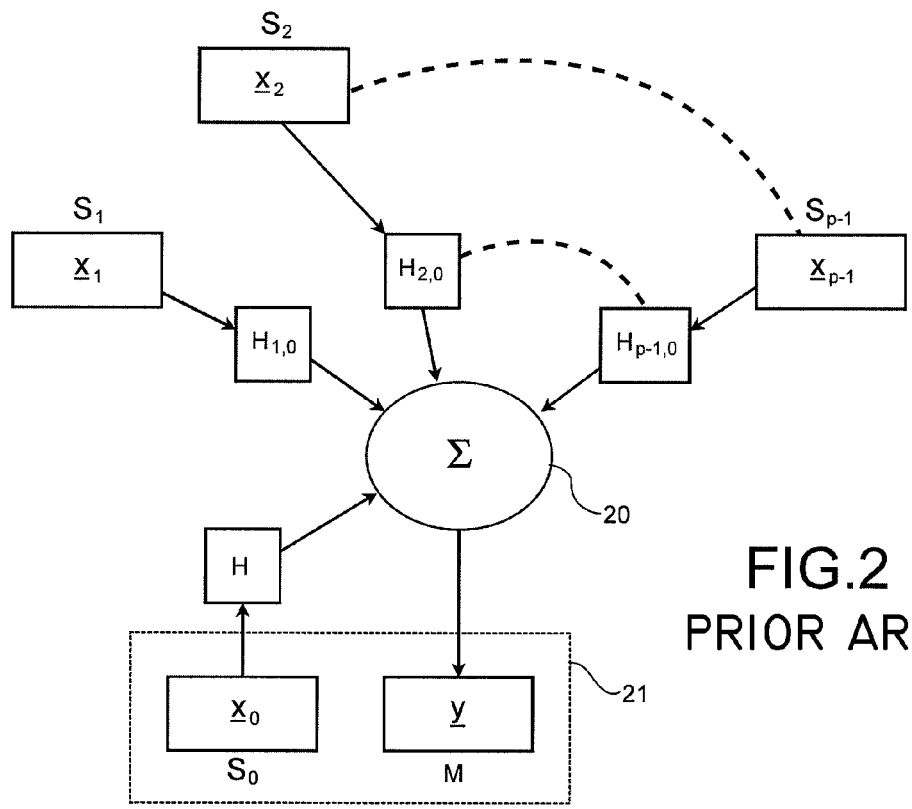
FIG. 2 shows schematic diagram of a distributed reflectometry device.
Figure 3:
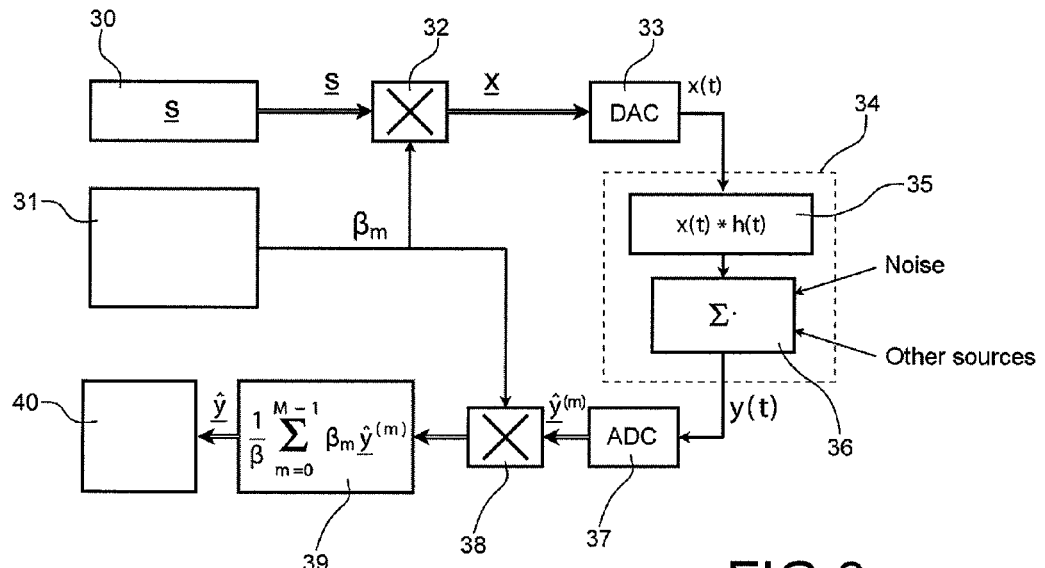
FIG. 3 shows the block diagram of the weighted-average reflectometry device according to the invention.

The device of the invention shown in FIG. 3 includes:
a transmission portion which successively comprises:
- a first memory 30 containing at least one test signal $\underline{s}$ of N samples,
- a second memory 31 containing M weighting coefficients enabling each reflectometer to be differentiated,
- a first multiplier 32 of a test signal $\underline{s}$ with a coefficient $\beta_m$ corresponding to a measurement m, providing a vector x,
- a digital-to-analog converter (DAC) 33 providing a signal x(t) linked to the physical system 34, i.e., to the line 35, the module Σ 36 symbolising the contribution of the other sources and noise, a reception portion which successively comprises:
- an analog-to-digital converter (ADC) 37 receiving a signal y(t) from the line and providing a vector $\hat{\underline{y}}^{(m)}$ for the measurement m,
- a second multiplier 38 of this vector $\hat{\underline{y}}^{(m)}$ with the coefficient $\beta_m$,
- an averaging module producing the average $$\frac{1}{\beta}\sum_{m=0}^{M-1}\beta_m \hat{\underline{y}}^{(m)} = \hat{\underline{y}},$$

a post-processing and analysis module 40.

The converters 33 and 37 can be moved, respectively, between the first memory 30 and the first multiplier 32, and between the second multiplier 38 and the averaging module 39.

In the case of single-source wired diagnostics, a measurement corresponds to a series of M sequences ($\underline{x}_0, \ldots, \underline{x}_{M-1}$) resulting in M measurements ($\underline{y}_0, \ldots, \underline{y}_{M-1}$). An average of these M measurements is next calculated according to relationship (3), which is written:

$$\hat{\underline{y}} = \frac{1}{M}\sum_{m=0}^{M-1} \underline{y}^{(m)} \tag{3}$$

M: is the number of measurements
$\underline{y}^{(m)}$: is the $m^{th}$ measurement.

The method of the invention consists in inserting a series of weighting coefficients ($\beta_0, \ldots \beta_{M-1}$). These coefficients are applied to the transmitted sequences, which results in the relationship $$x_m = \beta_m^{(p)} \underline{s}' = \beta_m^{(p)} \binom{s}{s} \tag{4}$$

where $\underline{s} = (s_1, s_2, \ldots, s_N)^T$ represents the original test signal and s' corresponds to two periods of the original signal (therefore 2N samples). Each transmitted sequence contains two periods of the original signal in order to be capable of maintaining a periodicity assumption. As a matter of fact, if $\underline{x}_m$ is different from $\underline{x}_{m-1}$, the first period corresponds to a transient state. The steady-state response of the line can then be measured during the second period. The true period of the transmitted signal is therefore 2.N.M samples.

Relationship (4) can be written in matrix form. To so, the following notations are introduced:
Weighting vector:

$$b^{(p)} = (\beta_1^{(p)}, \beta_2^{(p)}, \ldots, \beta_M^{(p)})$$

corresponding to reflectometer p.
Transmission matrix, which contains the signal transmitted by a source in question:

$$X = \begin{pmatrix} \underline{x}_1^T \\ \underline{x}_2^T \\ \vdots \\ \underline{x}_M^T \end{pmatrix} = (\underline{\tilde{X}} \mid \underline{\hat{X}}) = \begin{pmatrix} x_0 & \ldots & x_{N-1} & x_N & \ldots & x_{2N-1} \\ x_{2N} & \ldots & x_{3N-1} & x_{3N} & \ldots & x_{4N-1} \\ \vdots & & \vdots & \vdots & & \vdots \\ x_{(2M-2)N} & \ldots & x_{(2M-1)N-1} & x_{(2M-1)N} & \ldots & x_{2MN-1} \end{pmatrix}$$

Relationship (4) then corresponds to:

$$X = \underline{b}^{(p)} \underline{s}'^T \tag{5}$$

Reception matrix, which contains the measurements. It is defined in the same way as X:

$$Y = \begin{pmatrix} \underline{y}_1^T \\ \underline{y}_2^T \\ \vdots \\ \underline{y}_M^T \end{pmatrix} = (\underset{N}{\check{Y}} | \underset{N}{\hat{Y}}) = \begin{pmatrix} y_0 & \cdots & y_{N-1} & y_N & \cdots & y_{2-N-1} \\ y_{2N} & \cdots & y_{3N-1} & y_{3N} & \cdots & y_{4-N-1} \\ \vdots & & \vdots & \vdots & & \vdots \\ y_{(2M-2)N} & \cdots & y_{(2M-1)N-1} & y_{(2M-1)N} & \cdots & y_{2MN-1} \end{pmatrix}$$

Each line corresponds here to one of the M measurements.

The matrix $\check{Y}$ corresponds to the measurement of the transient state and is therefore ignored. The steady-state matrix is given by the relationship:

$$\hat{Y} = XH'^T + N \quad (6)$$

where H' is a matrix N×2N corresponding to the convolution with the line response:

$$H' = \begin{pmatrix} 0 & h_0 & h_1 & \cdots & h_{N-1} & 0 & \cdots & 0 \\ 0 & 0 & h_0 & \cdots & h_{N-2} & h_{N-1} & \cdots & 0 \\ \vdots & \ddots & & \ddots & \vdots & \vdots & \ddots & \vdots \\ 0 & 0 & 0 & \cdots & h_0 & h_1 & \cdots & h_{N-1} \end{pmatrix}$$

The response $h_n$ of the line is considered to be nil for $n \geq N$.

Given that $\tilde{X}=\hat{X}$, relationship (6) can be rewritten using the cyclic matrix H. One then obtains:

$$\hat{Y} = \hat{X}H^T + N \quad (7)$$

where matrix N represents the additive measurement noise and H is the cyclic matrix representing the response of the line as in relationship (2). The weighted average operation can then be written:

$$\underline{\hat{y}} = \frac{\sum_{m=0}^{M-1} \beta_m \hat{y}_m}{\sum_{m=0}^{M-1} \beta_m^2} = \frac{\hat{Y}^T \underline{b}}{\underline{b}^T \underline{b}} \quad (8)$$

By inserting (7) into (8), one obtains:

$$\underline{\hat{y}} = \frac{1}{\beta}(H\underline{s}\underline{b}^T + N)\underline{b} = H\underline{s} + \frac{N\underline{b}}{\beta} \quad (9)$$

where $\beta = \underline{b}^T\underline{b}$. The same result as in relationship (2) is indeed found again. Only the noise expression is different; the signal-to-noise ratio is greater.

The principle of orthogonal modulation then consists in parameterising the coefficients $\beta_m^{(p)}$ so that only the signal coming from the desired source is retrieved, the noise interference resulting from the other sources being cancelled out in the averaging operation.

It will now be studied how the various reflectometers interact, and the conditions that the weighting coefficients must verify will be deduced therefrom.

Interference Between the Sources

If it is considered that there is no synchronisation between the sources, the time lag between the coefficients weighting the test signals derived from the various sources and the averaging coefficients is entirely arbitrary. Thus, in order to be able to ensure discrimination of the signals irrespective of the desynchronisation between the sources, the weighting vectors should meet the following condition for $p_1 \neq p_2$:

$$\forall d\in 0, \ldots, M-1: \underline{b}_{(p1)}^T \Pi^d \underline{b}_{(p2)} = 0 \quad (10)$$

where d designates the number of offset samples between the two sources and Π the cyclic permutation matrix. This condition amounts to the fact that the pairs of weighting vectors have a zero cross-correlation function.

If, on the other hand, the various sources are synchronised (i.e., $d_p=0$), the vectors should be orthogonal to one another:

$$\underline{b}_{(p1)}^T \underline{b}_{(p2)} = 0 \quad (11)$$

The test signal contained in the vector $\underline{s}$ can be any, unlike the method described in the documents references as [1] and [3]. This method can therefore be used equally for the STDR-type reflectometry described in the document referenced as [4], or multicarrier reflectometry, as described in the document referenced as [2] or the like. Several families of vectors meet conditions (10) and/or (11).

Choice of the Weighting Coefficients

The choice of the weighting coefficients must meet conditions (10) and/or (11), but it must likewise take account of the impact of these coefficients in terms of the signal-to-noise ratio. The two cases are differentiated as a synchronous system corresponding to condition (11) and an asynchronous system corresponding to condition (10).

In each case, the minimum number of measurements to be carried out $M_{min}$ is specified. The number M of measurements chosen in the application must be a multiple of $M_{min}$ ($M=kM_{min}$, $k \in \mathbb{N}^*$) for the discrimination operation to be carried out correctly.

Synchronous System

This involves the simplest case because the weighting vectors must just be orthogonal in pairs. To meet this condition, the Hadamard functions can be used, but other choices are likewise possible.

$$\Pi = \begin{pmatrix} 0 & \cdots & 0 & 1 \\ 1 & \ddots & 0 & 0 \\ \vdots & \ddots & \vdots & \vdots \\ 0 & \cdots & 1 & 1 \end{pmatrix}.$$

To use the Hadamard functions, a number of sources p equal to a power of 2 ($P=2^r$, $r \in \mathbb{N}^*$) is preferably chosen. The weighting coefficients are then given by:

$$\beta_m^{(p)} = [H_p]_{p,m} \quad (12)$$

where $H_p$ is the Hadamard matrix of order P defined recursively by:

$$H_{2P} = \begin{pmatrix} H_P & H_P \\ H_P & -H_P \end{pmatrix}, \text{ with } H_2 = \begin{pmatrix} 1 & 1 \\ 1 & -1 \end{pmatrix} \quad (13)$$

A measurement number equal to the number of sources ($M_{min}=P$) is sufficient for orthogonality to be achieved.

Asynchronous System

In this case, the weighting vectors must remain orthogonal when a cyclic permutation of any number of samples is applied thereto. Two solutions are then possible for the choice of coefficients.

The first solution consists in using sine curves, for example:

$$\beta_m^{(p)} = \cos\left(2\pi \frac{mp}{M}\right) \quad (14)$$

The number of measurements required is only twice the number of reflectometers ($M_{min}=2p$). The disadvantage of the sine curves, on the one hand, is that the gain in signal-to-noise ratio is not quite as good as for the conventional average, and, on the other hand, that a multiplier is then required to implement the system. As a matter of fact, when the coefficients are given by binary functions (1 or −1), the multiplier can be replaced by a single condition, which simplifies the implementation.

In a second solution, in order to avoid the use of a multiplier, Rademacher functions are used, which are binary functions. The coefficients are then defined by:

$$\beta_m^{(p)} = \text{sign}\left[\sin\left(2^p \frac{\pi m}{M}\right)\right] \quad (15)$$

Here, $M_{min}=2^{P-1}$. The number of measurements therefore changes exponentially with the number of sources. More measurements are therefore required, which can become problematic for a significant number of reflectometers.

Implementation of the Method of the Invention

Proper functioning of the distributed reflectometry method depends on the accuracy of the clocks synchronising the various reflectometers. As a matter of fact, the theory presented above assumes that these clocks have the same frequency. In practice, errors relating to the frequencies of the oscillators are unavoidable. In order to ensure correct operation of the system, it is necessary that:

$$\frac{\Delta T_e}{T_e} < \frac{1}{N \cdot M} \text{ where } \frac{\Delta T_e}{T_e}$$

is the tolerance relating to the sampling period of the measurement signal.

The discrimination algorithm, namely the weighted averaging and synthesis steps for the signal can be implanted on an FPGA card provided with an analog input/output. The structure of the device of the invention is relatively well-suited to a cabled-type implementation for an FPGA (Field Programmable Gate Array), an ASIC (Application Specific Integrated Circuit) or integration into an "on chip" type device. However, implementation on a microcontroller is likewise foreseeable.

Figure 4:
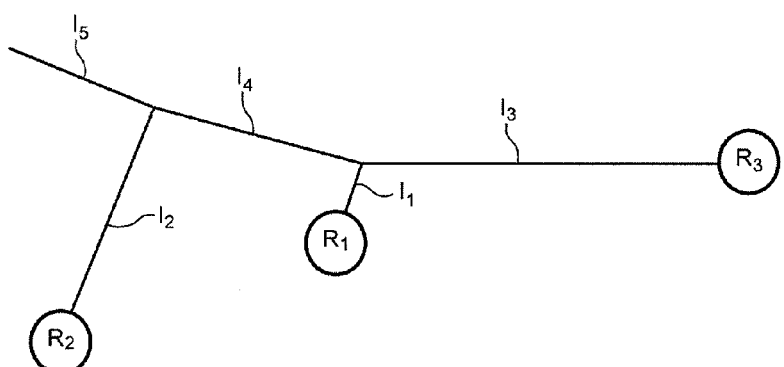
FIG. 4 shows the diagram of a network used for implementing the method of the invention.

The weighted-average distributed reflectometry method according to the invention was tested on network of coaxial lines $l_1$, $l_2$, $l_3$, $l_4$ and $l_5$ on which three measurement nodes were connected. As shown in FIG. 4, the three reflectometers $R_1$, $R_2$ and $R_3$ are connected to the network. Line $l_5$ is ends in an open circuit. The lines all have a characteristic impedance of 50Ω. Therefore, there is an impedance rupture at each branch point (or "Y"). These lines $l_1$ to $l_5$ have lengths of 0.6 m; 2 m; 3 m; 2 m and 1.5 m, respectively.

Figure 5:
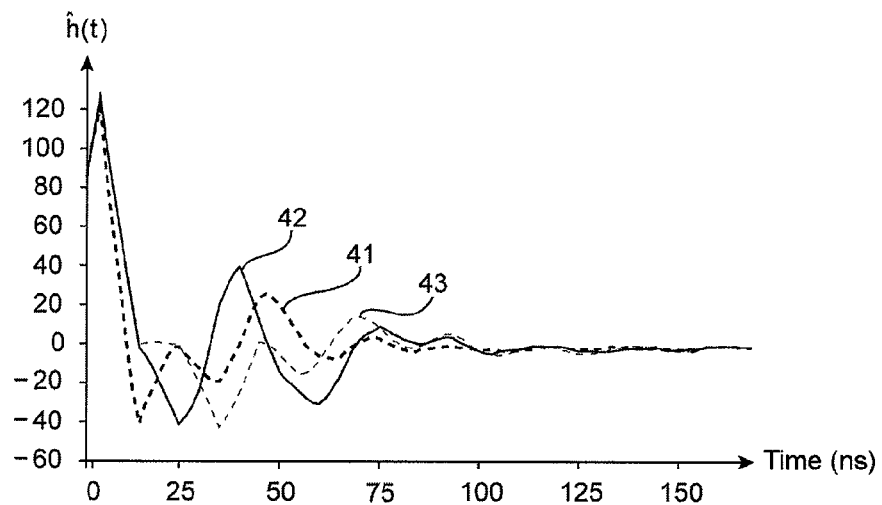
FIG. 5 shows results provided by the three reflectometers of the network of FIG. 4.

The test signal of each reflectometer is a pseudo-random sequence of 64 samples transmitted at a frequency of 100 MHz. The signal received is sampled with a frequency of 600 MHz. The number of averaged measurements is M=32. No synchronisation between the various reflectometers is assumed in this measurement, and the weighting coefficients are therefore defined by the Rademacher functions. The reflectograms 41, 42, 43 provided by the three reflectometers $R_1$, $R_2$, $R_3$, respectively, are shown in FIG. 5. It is observed that identification of the network is rather difficult because of the number of secondary echoes. Analytical post-processing can be applied to this result so as to extract the topology of the network therefrom, for example. On the other hand, no interference noise is present.

Figure 6:
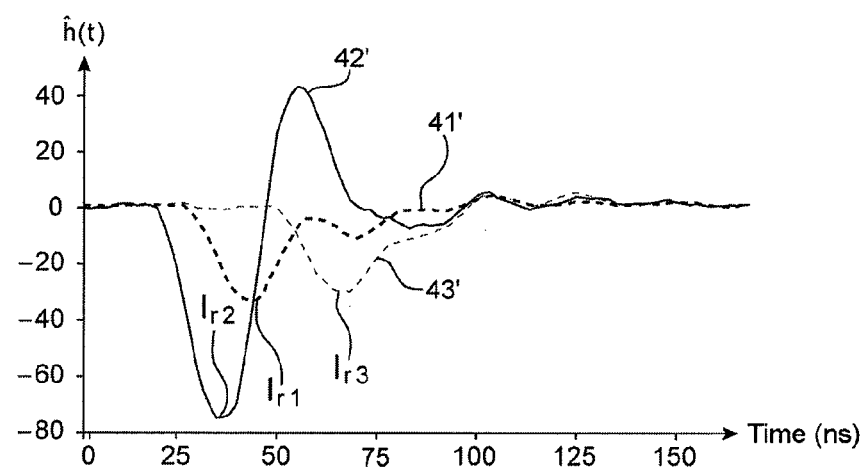
FIG. 6 shows the detection of a short circuit on branch $l_5$ of FIG. 4.

In order to analyse a machine-readable result, a fault (short circuit 1 meter before the end of branch $l_5$) is created on the network. The differences 41', 42' and 43' between the new reflectograms obtained and the original ones of FIG. 5 are then calculated. The results obtained can be seen in FIG. 6.

This type of operation can easily be carried out in the case of on-line diagnostics (i.e., continuous diagnostics during operation of the target system). The information relating to the fault is then given by the first peak of each curve. Referring to the diagram of the network in FIG. 4, and knowing that the short circuit is situated 50 cm from the "Y", the position of the first peak relative to the origin corresponds to:

$L_{r1}=l_1+l_4+0.5=3.1$ m for R1.
$L_{r2}=l_2+0.5=2.5$ m for R2.
$L_{r3}=l_3+l_4+0.5=5.5$ m for R3.

For the cables used, the velocity of propagation is $$v \approx \frac{2}{3} C_{lum} = 0.2 \cdot 10^9 \text{ m} \cdot \text{s}^{-1}.$$

The propagation time (roundtrip) is then given by $$t_i = 2\frac{l_i}{v} + t_0.$$

The value $t_0$, which corresponds to the propagation delay in the measurement system, is given by the first peak of FIG. 5 and corresponds here to approximately 6 ns. The following is then obtained:

$t_1 \approx 37$ ns, $t_2 \approx 32$ ns, $t_3 \approx 62$ ns.

Owing to these three pieces of information, and knowing the structure of the original network, the exact position of the fault on the network can be known. The negative polarity of the three peaks indicates that there is a drop in the impedance. Finally, the difference in amplitude is explained by the number of "Ys" through which the signal passes. As a matter of fact, the signal of reflectometers $R_1$ and $R_3$ passes through two "Ys" as opposed to a single one for $R_2$. This precise knowledge of the path of each signal enables improved interpretation of the amplitude of the peaks, which is of great interest in detecting non-obvious faults.

REFERENCES

[1] FR 2 907 910
[2] "Multicarrier reflectometry", by S. Naik, C. M. Furse, and B. Farhang-Boroujeny (Sensors Journal IEEE, 6(3):812-818, June 2006).
[3] "Distributed reflectometry-based diagnosis for complex wired networks" by N. Ravot, F. Auzanneau, Y. Bonhomme, M. O. Carrion, and F. Bouillault (EMC: Safety, Reliability and Security of Communication and Transportation Syst, EMC Workshop, Paris, June 2007).
[4] "Analysis of spread spectrum time domain reflectometry for wire fault location", by P. Smith, C. Furse, and J. Gunther (Sensors Journal IEEE, 5(6):1469-1478, December 2005).

The invention claimed is:

1. A distributed reflectometry device for diagnosing a transmission network, the transmission network comprising at least one transmission line and a plurality of reflectometers connected to the transmission network, comprising:
for each reflectometer:
  a transmission portion comprising:
    a first memory configured to store a plurality of at test signals of N samples, each corresponding to a reflectometer;
    a second memory configured to store M weighting coefficients, $\beta_o \ldots \beta_{m-1}$ corresponding to M measures, corresponding to M measures, enabling the reflectometer to be differentiated from the other reflectometers;
    a first multiplier of a test signal (s) issued from the first memory with a weighting coefficient $\beta_m$ issued from the second memory, for a measurement m comprised between 0 and M−1, the first multiplier providing a vector (x);
    a digital-to-analog converter connected to the transmission network, and a
  reception portion comprising:
    an analog-to-digital converter configured to receive a signal (y(t)) from the transmission network and to provide a vector ($\underline{\hat{y}}^{(m)}$) for a measurement m comprised between 0 and M−1,
    a second multiplier configured to multiply the vector ($\underline{\hat{y}}^{(m)}$) with a weighting coefficient issued from the second memory,
    an averaging module configured to enable cancelation of the contribution from the other reflectometers; and
    a post-processing and analysis module receiving an output of the averaging module so as to provide information about the transmission network's structure or about electrical faults present on the transmission network.

2. A device according to claim 1, wherein the number M is such that: M=kMmin, wherein k∈ℵ, ℵ being all the natural numbers, and Mmin is a minimum number of measurements.

3. A device according to claim 2, wherein, in the case where the reflectometers are synchronized with one another, weighting vectors $b^T_{(p1)}$ and $b_{(p1)}$ are orthogonal to one another, such that $\underline{b}_{(p1)}^T \underline{b}_{(p2)}=0$, and wherein p1 and p2 correspond respectively to a first and second reflectometer in the transmission network.

4. A device according to claim 3, wherein the minimum number of measurements Mmin is equal to the number p of reflectometers and the weighting coefficients are such that: $\beta_m^{(p)}=[H_p]p,m$, wherein Hp corresponds to a Hadamar matrix of order p.

5. A device according to claim 2, wherein, in the case where the reflectometers are not synchronized with one another, the weighting coefficients meet the following condition:

†d∈o, ..., M−1

$\underline{b}_{(p1)}^T \Pi^d \underline{b}_{(p2)}=0$ where d designates the number of offset samples between the two reflectometers and Π corresponds to a cyclic permutation matrix, and wherein p1 and p2 correspond respectively to a first and second reflectometer in the transmission network.

6. A device according to claim 5, wherein the minimum number of measurements Mmin is equal to twice the number p of reflectometers, and wherein the weighting coefficients are represented by sine curves.

7. A device according to claim 5, wherein the minimum number of measurements Mmin is such that Mmin=2p−1 and the weighting coefficients are described by a Rademacher function of:

$$\beta_m^{(p)})\text{sign}\left[\sin\left(2^p \frac{\pi m}{M}\right)\right].$$

8. A device according to claim 1, wherein the device is configured as a distributed reflectometry device for on-line diagnosis of a transmission network.

9. A distributed reflectometry method for diagnosing a transmission network, the transmission network comprising at least one transmission line and a plurality of reflectometers connected to the transmission network, the method comprising:
for each reflectometer:
  during transmission:
    using a transmitter to multiply a test signal of N samples, corresponding to a reflectometer, issued from a first memory, with a weighting coefficient $\beta_m$ issued from a second memory for a measurement m, comprised between 0 and M−1, enabling the reflectometer to be differentiated from the other reflectometers and to provide a vector (x),
    using the transmitter to digital-to-analog convert the vector (x) to provide a signal (x(t)) linked to the transmission network, and
  during reception:
    using a receiver to analog-to-digital convert a received signal (y(t)) from the transmission network and providing a vector ($\underline{\hat{y}}^{(m)}$) with a measurement m comprised between 0 and M−1,
    using a receiver to multiply the vector ($\underline{\hat{y}}^{(m)}$) with a weighting coefficient $\beta_m$ issued from the second memory,
    using an averaging module, averaging multiplied vector ($\alpha_m \underline{\hat{y}}^{(m)}$) to cancel the contribution of the other reflectometers, and
    post-processing and analyzing the averaged signal using the receiver so as to provide information about the transmission network's structure or about electrical faults present on the transmission network.

10. A method according to claim 9, wherein, in one application, the number M is such that: M=kMmin, and wherein: k∈ℵ, ℵ being all the natural numbers, and Mmin is a minimum number of measurements.

11. A method according to claim 10, wherein, in the case where the reflectometers are synchronized with one another, the vectors are orthogonal to one another, such that: $\underline{b}_{(p1)}^T \underline{b}_{(p2)}=0$, and wherein p1 and p2 correspond respectively to a first and second reflectometer in the transmission network.

12. A method according to claim 11, wherein the minimum number of measurements Mmin is equal to the number p of reflectometers and the weighting coefficients are such that: $\beta_m^{(p)}=[H_p]p, m$, and wherein Hp corresponds to a Hadamar matrix of order p.

13. A method according to claim 10, wherein, in the case where the reflectometers are not synchronized with one another, the weighting vectors meet the following condition:

†d∈o, ..., M−1

$\underline{b}_{(p1)}^T \Pi^d \underline{b}_{(p2)}=0$ where d designates the number of offset samples between the two reflectometers and Π corresponds to a cyclic permutation matrix.

14. A method according to claim 13, wherein the minimum number of measurements Mmin is equal to twice the number p of reflectometers and wherein the weighting coefficients are represented by sine curves.

15. A method according to claim 13, wherein the minimum number of measurements is such that Mmin=2p−1 and the weighting coefficients are described by a Rademacher function of:

$$\beta_m^{(p)} \text{sign}\left[\sin\left(2^p \frac{\pi m}{M}\right)\right].$$

16. A method according to claim 9, wherein the method is a distributed reflectometry method for on-line diagnosis of a transmission network.

17. A distributed reflectometry device for diagnosing a wired network, comprising at least one transmission line and a plurality of reflectometers connected at several points of the wired network, comprising:
for each reflectometer:
a portion for transmitting a test signal (x (t)) into the wired network, comprising:
a first memory containing at least one test signal s of N samples,
a second memory containing M weighting coefficients $\beta_o \ldots \beta_{m-1}$ enabling each reflectometer to be differentiated,
a first multiplier of the test signal s of N samples, corresponding to the reflectometer, with a weighting coefficient $\beta_m$, corresponding to a measurement m, to provide a vector (x),
a digital-to-analog converter connected to the wired network, a portion for receiving a measurement signal (y (t)) from the wired network, which comprises:
an analog-to-digital converter receiving a measurement signal (y (t)) from the wired network and providing a vector ($\hat{y}^{(m)}$) for a measurement m,
a second multiplier of this vector ($\hat{y}^{(m)}$) with the weighting coefficient $\beta_m$ from the second memory, corresponding to the measurement m,
an averaging module producing the average $$\hat{y} = \frac{1}{\beta} \sum_{m=0}^{M=1} \beta_m \hat{y}^{(m)}$$

enabling the contribution of the other reflectometers to be cancelled, and
a post-processing and analysis module receiving the average and enabling information about the wired network's structure or about electrical faults present on the wired network to be obtained.

18. A distributed reflectometry method for diagnosing a wired network, comprising at least one transmission line and a plurality of reflectometers connected at several points of the wired network and a first memory containing a plurality of test signal s of N samples, each corresponding to a reflectometer, the method comprising:
for each reflectometer:
during transmission of a test signal (x (t)) issued from a first memory in the wired network:
using a transmitter to multiply the signal s of N samples with a weighting coefficient $\beta_m$ from a second memory corresponding to a measurement m, enabling the reflectometer to be differentiated from the other reflectometers and to provide a vector (x),
using the transmitter to digital-to-analog convert the vector (x) to provide a signal (x (t)),
during reception of a measurement signal (y (t)) from the wired network:
using a receiver to analog-to-digital convert the measurement signal (y (t)) from the wired network and providing a vector ($\hat{y}^{(m)}$) for the measurement m,
using a receiver to multiply the vector (x) with a weighting coefficient $\beta_m$ issued from the second memory, corresponding to the measurement m,
using an averaging module, averaging to produce the average $$\hat{y} = \frac{1}{\beta} \sum_{m=0}^{M=1} \beta_m \hat{y}^{(m)}$$

enabling the contribution of the other reflectometers to be canceled, and
post-processing and analyzing, using the receiver to enable information to be obtained about the wired network's structure or about electrical faults present on the wired network.

19. A distributed reflectometry device for diagnosing a transmission network, the transmission network comprising at least one transmission line and a plurality of reflectometers connected to the transmission network, comprising:
for each reflectometer:
a transmission portion comprising:
a first memory configured to store a plurality of test signals of N samples, each corresponding to a reflectometer,
a second memory configured to store M weighting coefficients, $\beta_0 \ldots \beta_{m-1}$,
a first multiplier of a test signal (s) of N samples with a weighting coefficient $\beta_m$ issued from the second memory for a measurement m, the first multiplier providing a vector (x),
a digital-to-analog converter connected to the transmission network; and
a reception portion comprising:
an analog-to-digital converter configured to receive a signal (y(t)) from the transmission network and to provide a vector ($\hat{y}^{(m)}$) for a measurement m comprised between 0 and M−1,
a second multiplier configured to multiply the vector ($\hat{y}^{(m)}$) with a weighting coefficient $\beta_m$ issued from the second memory,
an averaging module configured to enable cancelation of the contribution from the other reflectometers, and
a post-processing and analysing module receiving an output of the averaging module so as to provide information about the transmission network's structure or about electrical faults present on the transmission network;
wherein the number M is such that: M=kMmin, wherein k∈ℕ, ℕ being all of the natural numbers, and Mmin is a minimum number of measurements;

where in the case where the reflectometers are synchronized with one another, weighting vectors $\underline{b}^T_{(p1)}$ and $\underline{b}_{(p1)}$ are orthogonal to one another, such that $\underline{b}T_{(p1)}\underline{b}_{(p2)}=0$ and wherein p1 and p2 correspond respectively to a first and second reflectometer in the transmission network.

20. A distributed reflectometry method for diagnosing a transmission network, the transmission network comprising at least one transmission line and a plurality of reflectometers connected to the transmission network, the method comprising:

for each reflectometer:

during transmission:

using a transmitter to multiply a test signal of N samples with a weighting coefficient $\beta_m$ issued from a second memory for a measurement m, providing a vector (x), using the transmitter to digital-to-analog convert the vector (x) to provide a signal (x(t)) linked to the transmission network; and during reception:

using a receiver to analog-to-digital convert a received signal (y(t)) from the transmission network and providing a vector ($\hat{\underline{y}}^{(m)}$) for a measurement m, using the receiver to multiply the vector ($\hat{\underline{y}}^{(m)}$) with a weighting coefficient $\beta_m$ issued from the second memory, using an averaging module, averaging multiplied vector ($\beta_m \hat{\underline{y}}^{(m)}$) to cancel the contribution of the other reflectometers, and post-processing and analyzing the averaged signal using the receiver;

wherein, in one application, the number M is such that: M=kMmin, and wherein: k∈ℵ, ℵ being all of the natural numbers, and Mmin is a minimum number of measurements, wherein, in the case where the reflectometers are synchronized with one another, the vectors are orthogonal to one another, such that: $\underline{b}_{(p1)}^T\underline{b}_{(p2)}=0$, and wherein p1 and p2 correspond respectively to a first and second reflectometer in the transmission network.

* * * * *

UNITED STATES PATENT AND TRADEMARK OFFICE
CERTIFICATE OF CORRECTION

PATENT NO. : 8,918,295 B2
APPLICATION NO. : 13/123228
DATED : December 23, 2014
INVENTOR(S) : Adrien Lelong It is certified that error appears in the above-identified patent and that said Letters Patent is hereby corrected as shown below:

Title Page, item (57)

In column 1 (page 1, Abstract) at line 13, Change "multiplier of" to --multiplier is--.

In the Specification

In column 2 at lines 20-24 (approx.), Change "$H \begin{pmatrix} h_0 & h_1 & \cdots & h_{N-1} \\ h_{N-1} & h_0 & \cdots & h_{N-1} \\ \vdots & \ddots & \ddots & \vdots \\ h_1 & h_2 & \cdots & h_0 \end{pmatrix}$," to $H = \begin{pmatrix} h_0 & h_1 & \cdots & h_{N-1} \\ h_{N-1} & h_0 & \cdots & h_{N-1} \\ \vdots & \ddots & \ddots & \vdots \\ h_1 & h_2 & \cdots & h_0 \end{pmatrix}$ --.

In column 2 at line 28 (approx.), Change "pulse," to --pulse--.

In column 3 at line 45, Change "includes:" to --include:--.

In column 8 at line 5 (approx.), Change "$\dagger d\in 0,$" to --$\forall d \in 0,$--.

In the Claims

In column 11 at line 8, In Claim 1, change "of at" to --of--.

In column 11 at lines 9-10, In Claim 1, change "reflectometer;" to --reflectometer,--.

In column 11 at line 12, In Claim 1, change "$\beta_{m-1}$ corresponding to M measures," to --$\beta_{m-1}$,--.

In column 11 at lines 14-15 (approx.), In Claim 1, change "reflectometer;" to --reflectometer,--.

Signed and Sealed this
Eighth Day of March, 2016

Michelle K. Lee
*Director of the United States Patent and Trademark Office*

CERTIFICATE OF CORRECTION (continued)
U.S. Pat. No. 8,918,295 B2

In column 11 at line 20, In Claim 1, change "(x);" to --(x),--.

In column 11 at line 29, In Claim 1, after "coefficient" insert --coefficient βm--.

In column 11 at line 32, In Claim 1, change "reflectometers;" to --reflectometers,--.

In column 11 at line 55 (approx.), In Claim 5, change "$\dagger d \in O,$" to --$\forall d \in O,$--.

In column 12 at line 34, In Claim 9, change "with" to --for--.

In column 12 at line 41, In Claim 9, change "($\alpha_m$" to --($\beta_m$--.

In column 12 at line 64 (approx.), In Claim 13, change "$\dagger d \in O,$" to --$\forall d \in O,$--.

In column 13 at line 31, In Claim 17, change "βm-$_1$" to --βm-$_1$,--.

In column 13 at line 60, In Claim 18, after "network," insert --the wired network--.

In column 14 at line 14, In Claim 18, change "vector (x)" to --vector--.

In column 14 at line 27, In Claim 18, change "analyzing," to --analyzing--.

In column 15 at line 1, In Claim 19, change "where in" to --wherein--.